United States Patent
Xiang et al.

(10) Patent No.: US 6,190,952 B1
(45) Date of Patent: Feb. 20, 2001

(54) MULTIPLE SEMICONDUCTOR-ON-INSULATOR THRESHOLD VOLTAGE CIRCUIT

(75) Inventors: Qi Xiang; Bin Yu, both of Santa Clara, CA (US)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 09/261,273

(22) Filed: Mar. 3, 1999

(51) Int. Cl.[7] .................... H01L 21/84; H01L 21/8234; H01L 21/336; H01L 21/3205; H01L 21/4763
(52) U.S. Cl. ................ 438/155; 438/200; 438/225; 438/259; 438/589
(58) Field of Search ................... 438/152, 295, 438/589, 305, 155, 200, 225, 259

(56) References Cited

U.S. PATENT DOCUMENTS

| | | |
|---|---|---|
| 3,869,786 * | 3/1975 | Adam et al. . |
| 5,100,830 * | 3/1992 | Morita . |
| 5,448,094 * | 9/1995 | Hsu . |
| 5,652,162 * | 7/1997 | Liao . |
| 5,773,336 * | 6/1998 | Gu . |

OTHER PUBLICATIONS

"Ultra–Thin–Body Silicon–on–Insulator MOSFET's for Terabit–Scale Integration" by Yu, et al. Department of Electrical Engineering Computer Sciences, University of California Berkeley.

* cited by examiner

Primary Examiner—John F. Niebling
Assistant Examiner—Ron Pompey
(74) Attorney, Agent, or Firm—Foley & Lardner

(57) ABSTRACT

An ultra-large-scale integrated (ULSI) circuit includes MOSFETs which have different threshold voltages and yet have the same channel characteristics. The MOSFETs are provided on an SOI substrate. The thickness of a thin film on the substrate is varied to adjust the threshold voltage. The threshold voltage can be varied by roughly 240 mV. The thickness of the thin film can be adjusted through a LOCOS process.

20 Claims, 4 Drawing Sheets

MULTIPLE SEMICONDUCTOR-ON-INSULATOR THRESHOLD VOLTAGE CIRCUIT

CROSS REFERENCE TO RELATED APPLICATIONS

This application is related to U.S. patent application No. 09/187,881 by Lin, entitled "Heavily-Doped Polysilicon/Germanium Thin Film Formed by Laser Annealing." This application is also related to U.S. patent application Ser. No. 09/187,842, filed on an even date herewith by Yu et al., entitled "Integrated Circuit Having Transistors with Different Threshold Voltages." This application is further related to U.S. application Ser. No. 09/187,171 by Yu, entitled "Multiple Threshold Voltage Transistor Implemented by a Damascene Process." This application is even further related to U.S. patent application Ser. No. 09/261,274, filed on an even date herewith, by Yu, et al., entitled "Gate Stack Structure for Multiple Threshold Voltage Circuit."

BACKGROUND OF THE INVENTION

The present invention relates generally to an integrated circuit (IC) and the fabrication of an integrated circuit. More particularly, the present invention relates to an integrated circuit with multiple or selectable threshold voltage values.

Ultra-large-scale integrated (ULSI) circuits generally include a multitude of transistors, such as, more than one million transistors and even several million or more transistors, that cooperate to perform various functions for an electronic component. Some transistors on the integrated circuit (IC) or chip are part of circuits which perform different operations than other circuits.

Some transistors perform functions for circuits in the critical signal path of the IC, where speed is crucial to the proper operation of the IC. In contrast, other transistors perform functions for circuits in the non-critical signal path of the IC, where speed is not as important. Transistors in the non-critical signal path are preferably designed to consume less power than transistors in the critical signal path. Still other transistors may perform functions for a signal path having a criticality somewhere between the critical signal path and the non-critical signal path and, accordingly, have different speed and power consumption requirements.

Generally, transistors which have higher threshold voltages (Vth) consume less power than transistors which have low threshold voltages due to smaller off-state current leakage. Threshold voltage refers to the minimum gate voltage necessary for the onset of current flow between the source and the drain of a transistor. Transistors which have lower threshold voltages are faster (e.g., have quicker switching speeds) than transistors which have higher threshold voltages.

Currently, deep-submicron CMOS is the primary technology for ULSI devices. Over the last two decades, reduction in the size of CMOS transistors has been a principal focus of the microelectronics industry. However, as the sizes of the various components of the transistor are reduced, operational parameters and performance characteristics can change. Appropriate transistor performance must be maintained as transistor size is decreased.

One of the major roadblocks to transistor miniaturization is related to subthreshold voltage characteristics. The subthreshold voltage characteristic refers to the relationship between voltage and current at gate voltages below the threshold voltage of the transistor (e.g., below turn-on voltages of the transistor). Generally, the threshold voltage characteristic of a transistor does not necessarily scale or change proportionally with the size of the transistor. The slope of the subthreshold voltage characteristic is related to $(\ln 10)(kT/q)$ where k is the Boltzman constant, T is absolute temperature, and q is the charge of electrons. As demonstrated by the above equation, portion of the subthreshold voltage characteristic is independent of oxide thickness, channel length, and supply voltage. Thus, transistor performance at subthreshold voltage levels does not scale with respect to transistor structures and characteristics, such as, oxide thickness, channel length, and supply voltage.

Generally, the current at subthreshold voltage levels (e.g., the leakage current) in a transistor, such as, MOSFET, increases exponentially as the threshold voltage decreases. Therefore, to maintain off-state current within standard specifications, the threshold voltage cannot be reduced appreciably in conventional ICs or chips. The current associated with subthreshold voltages is present whether or not the transistor is in operation and can cause the integrated circuit to have a high passive power output, which is particularly troublesome for low-power or portable systems.

Transistors, such as, metal oxide semiconductor field effect transistors (MOSFETs), are generally either bulk semiconductor-type devices or silicon-on-insulator (SOI)-type devices. Most integrated circuits are fabricated in a CMOS process on a bulk semiconductor substrate.

In bulk semiconductor-type devices, transistors, such as, MOSFETs, are built on the top surface of a bulk substrate. The substrate is doped to form source and drain regions, and a conductive layer is provided between the source and drain regions. The conductive layer operates as a gate for the transistor; the gate controls current in a channel between the source and the drain regions. As transistors become smaller, the body thickness of the transistor (or thickness of depletion layer below the inversion channel) must be scaled down to achieve superior short-channel performance.

Conventional SOI-type devices include an insulative substrate attached to a thin-film semiconductor substrate that contains transistors similar to the MOSFETs described with respect to bulk semiconductor-type devices. The insulative substrate includes a buried insulative layer separating an upper semiconductor layer from the lower semiconductor base layer. The transistors on the insulative substrate have superior performance characteristics due to the thin-film nature of the semiconductor substrate and the insulative properties of the insulative substrate. In a fully depleted (FD) MOSFET, the body thickness is so small that the depletion region has a limited vertical extension, thereby eliminating link effect and lowering hot carrier degradation. The superior performance of SOI devices is manifested in superior short-channel performance (i.e., resistance to process variation in small size transistor), near-ideal subthreshold voltage swing (i.e., good for low off-state current leakage), and high saturation current.

In ULSI circuits, transistors, such as, MOSFETs, with low threshold voltages can be used in logic paths which have high speed requirements. In contrast, transistors, such as, MOSFETs, with higher threshold voltages can be used in the non-critical signal path (e.g. storage devices), thereby reducing the off-state leakage current and, hence, reducing the standby power consumption of the entire IC.

ULSI circuits are generally manufactured in accordance with complementary metal oxide semiconductor (CMOS) technology and design criteria which utilize N-channel MOSFETs and P-channel MOSFETs. The N-channel and P-channel MOSFETs generally include a polysilicon gate structure disposed between a drain and a source. The polysilicon gate structure controls charge carriers in a channel region to turn the transistor on and off.

According to conventional designs, multiple threshold voltages for transistors on a single IC are obtained by selectively providing channel implants for the transistors. Additional channel implants (e.g., doping the channel region to change the work function difference between the gate and the channel) are used for those transistors with higher threshold voltage requirements (e.g., Vth>0.3V). The transistors which have lower voltage threshold requirements (e.g., Vth<0.2V–0.3V) do not receive the additional channel implants.

Utilizing channel implants to adjust the threshold voltages of transistors can be problematic because transistor short-channel performance is very susceptible to process variations. In particular, short-channel performance is extremely sensitive to channel implants or additional doping steps. Accordingly, the modification of the channel with implants can result in significantly different short-channel performance between transistors, which adversely affects the predictability of the design and operability of the IC. This characteristic is particularly problematic as transistors become smaller and packing densities increase. Additionally, providing channel implants adds additional steps to the fabrication process and makes the IC more difficult to manufacture.

Multiple threshold voltage devices can be particularly advantageous if a semiconductor-on-insulator or silicon-on-insulator (SOI) substrate is used. As stated above, junction capacitance is significantly reduced in SOI devices, especially in FD MOSFETS. Junction capacitance adversely affects the operational characteristics of the device. FD SOI MOSFETS also have a significantly lower subthreshold voltage slope. Therefore, the current at subthreshold voltage levels is lower when compared with conventional MOSFETS at the same threshold voltage.

Thus, there is a need for an integrated circuit or electronic device that includes transistors having different threshold voltage levels which can be manufactured according to a simpler process. Further still, there is a need for an ULSI circuit that does not utilize channel implants to adjust threshold voltages among transistors. Even further still, there is a need for a damascene process for fabricating transistors having multiple threshold voltages that is higher in density and can be more efficiently manufactured. Yet further still, there is a need for an SOI integrated circuit with multiple threshold voltages.

SUMMARY OF THE INVENTION

The present invention is related to a method of manufacturing an integrated circuit including a plurality of transistors. The transistors include a first transistor having a first threshold voltage and a second transistor having a second threshold voltage. The first threshold voltage is different than the second threshold voltage. The method includes forming an oxidation structure at a first location on a substrate, removing the oxidation structure, providing a gate associated with the first transistor at the first location, and providing a second gate associated with the second transistor at a second location on the substrate. Removing the oxidation structure leaves a recessed portion at the first location on the substrate.

The present invention further relates to a method of manufacturing an integrated circuit (IC) including a plurality of transistors. The method includes providing a local oxidation of silicon (LOCOS) structure at a first location on a substrate, removing the LOCOS structure, and providing at least one of the transistors at the first location on the substrate. Removing the LOCOS structure leaves a recessed portion at the first location on the substrate.

The present invention still further relates to a method of manufacturing an ultra-large scale integrated (ULSI) circuit on a semiconductor-on-insulator substrate. The substrate includes a semiconductor film. The method includes selectively oxidizing the semiconductor film to form a structure at a first location, etching the structure to remove the structure from the semiconductor film, and forming a transistor at the first location.

The present invention relates to a semiconductor-on-insulator integrated circuit having a semiconductor layer disposed above an insulative surface. The integrated circuit includes a first MOSFET positioned above a relatively thin portion of the semiconductor layer and a second MOSFET positioned above a relatively thicker portion of the semiconductor layer. The first MOSFET has a relatively low threshold voltage, and the second MOSFET has a relatively higher threshold voltage.

According to one exemplary aspect of the present invention, a technique for achieving selectable threshold voltage transistors on a single chip or integrated circuit utilizes different thicknesses of thin films to control threshold voltages. Fully depleted (FD) MOSFETs are provided on an SOI substrate in accordance with an embodiment of the present invention. The present invention advantageously utilizes the dependence of the threshold voltage on the thickness of a silicon film in a FD SOI MOSFET (e.g., threshold voltage decreases as the silicon film thickness decreases).

According to another exemplary aspect of the present invention, the thickness of the semiconductor film can be selectively controlled by utilizing a LOCOS process. Transistors for use on critical paths are provided on a thinner silicon film. Critical paths can include high-speed logic paths. High threshold voltage transistors can be utilized everywhere else on the integrated circuit to minimize standby power consumption.

BRIEF DESCRIPTION OF THE DRAWINGS

The present invention will hereafter be described with reference to the accompanying drawings, wherein like numerals denote like elements, and.

DETAILED DESCRIPTION OF THE PREFERRED EMBODIMENTS

Figure 1:
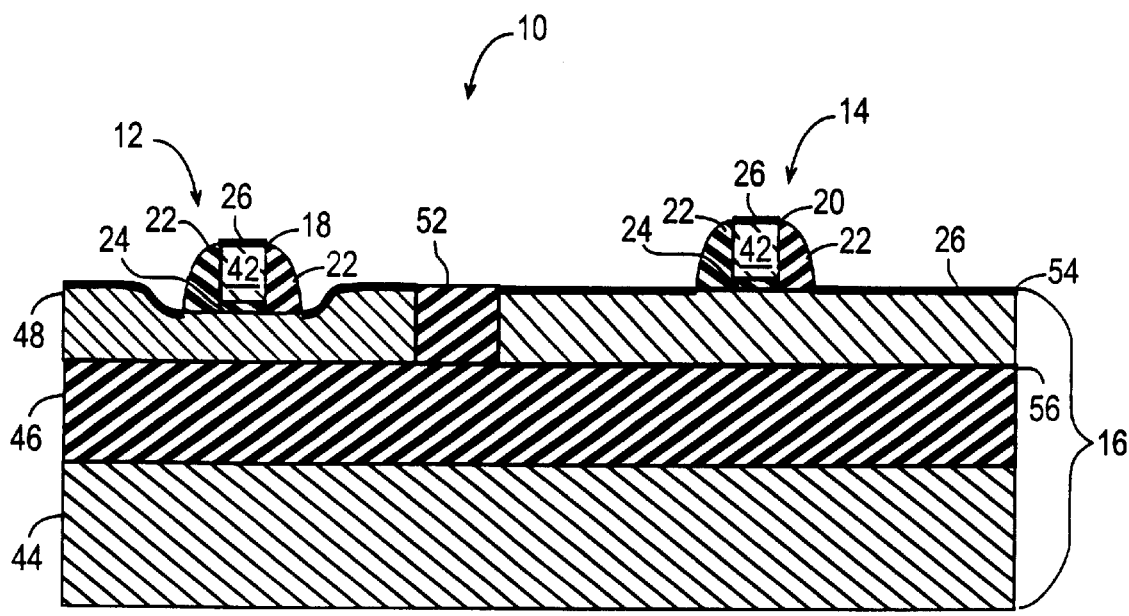
FIG. 1 is a cross-sectional view of a portion of an integrated circuit in accordance with an exemplary embodiment of the present invention, the integrated circuit provided on a semiconductor-on-insulator substrate.

With reference to FIG. 1, a portion 10 of an integrated circuit (IC) or chip includes a transistor 12 and a second transistor 14. Portion 10 is preferably part of an ultra-large-scale integrated (ULSI) circuit having 1,000,000 or more transistors. Portion 10 is manufactured as part of the IC on a semiconductor wafer, such as, a silicon wafer.

Transistors 12 and 14 are disposed on a substrate 16 that is preferably a semiconductor-on-insulator or silicon-on-insulator (SOI) substrate. Transistor 12 includes a gate stack 18, and transistor 14 includes a gate stack 20. Transistors 12 and 14 also both include a drain, a source, and a channel. Transistors 12 and 14 have a threshold voltage between 0.3V and 0.2V or less.

Each of gate stack 18 and gate stack 20 includes sidewall spacers 22, a gate dielectric 24, and a silicide layer 26. Silicide layer 26 is preferably a 100 to 200 Å thick layer of cobalt silicide. Alternatively, tungsten silicide or nickel silicide can be utilized.

Spacers 22 and dielectric 24 can be silicon dioxide or other insulating material. Spacers 22 are deposited as a silicon dioxide layer by chemical vapor deposition (CVD), which is selectively etched. Dielectric 24 is a thermally grown 500–100 Å thick layer of silicon dioxide. Alternatively, spacers 22 and dielectric 24 can be a nitride material or other insulative material.

Gate stack 18 includes a gate conductor 40, and gate stack 20 includes a gate conductor 42. Gate conductors 40 and 42 are preferably manufactured from a semiconductor material, such as, a 1000 to 2000 Å thick polysilicon layer. Gate conductors 40 and 42 can also be a compound material including germanium or a metal material.

If transistors 12 and 14 are N-channel transistors, transistor 12 has a lower threshold voltage than transistor 14. Transistor 12 is preferably utilized in a critical signal path or high speed logic circuit. Conversely, if transistors 12 and 14 are P-channel transistors, transistor 12 has a higher threshold voltage than transistor 14. In this P-channel embodiment, transistor 14 is utilized in the critical signal path, and transistor 12 is part of a non-critical signal path (e.g., storage).

Exemplary values for transistors 12 and 14 (N-channel) are given below. Transistor 12 (N-channel) has a threshold voltage of approximately 0.2V, and transistor 14 (N-channel) has a threshold voltage of approximately 0.32V. Transistors 12 and 14 are preferably fully depleted metal oxide semiconductor field effect transistors (FD MOSFETs).

Substrate 16 includes a base layer 44, a buried oxide layer 46, and a semiconductor layer 48. Base layer 44 is preferably a several hundred micron thick layer of silicon. Buried oxide layer 46 is preferably a several thousand (3000–5000) Å thick layer of silicon dioxide. Layer 48 is preferably a thin-film layer of semiconductor material, such as, a 1000–1500 Å thick layer of silicon.

Substrate 16 may be purchased in a wafer form or may be configured from a silicon wafer to be of a form shown in FIG. 1. For example, layer 46 can be formed by implanting oxygen at a dose of $10^{17}$ dopants per $cm^2$ and annealing at a high temperature. Alternatively, layer 46 can be grown or deposited on layer 44. Layer 48 can be deposited on layer 46 by chemical vapor deposition (CVD).

Substrate 16 includes a shallow trench isolation structure 52. Structure 52 is preferably 1–2 microns wide and 1000–5000 Å deep. Preferably, structure 52 reaches from a top surface 54 of layer 48 to a bottom surface 56 of layer 48. Bottom surface 56 is adjacent layer 46. Structure 52 can be created by etching a trench in layer 48 and filling the trench with silicon dioxide in a tetraethyl orthosilicate (TEOS) process.

Substrate 16 provides an SOI substrate that provides significant advantages over bulk-type substrates. However, transistors 12 and 14 could utilize the principles of the present invention on a bulk-type substrate.

Transistor 12 (N-channel) has a lower threshold voltage than transistor 14 due to the decreased thickness of layer 48 at the location associated with transistor 12. Preferably, top surface 54 of layer 48 underneath gate stack 18 is approximately 700–1000 Å from bottom surface 56 of layer 48. In contrast, top surface 54 of layer 48 is approximately 100–5000 Å from bottom surface 56 of layer 48 at the location of gate stack 20. Generally, the threshold voltage associated with transistor 12 is less because the thickness of layer 48 is less at the location of transistor 12.

Figure 2:
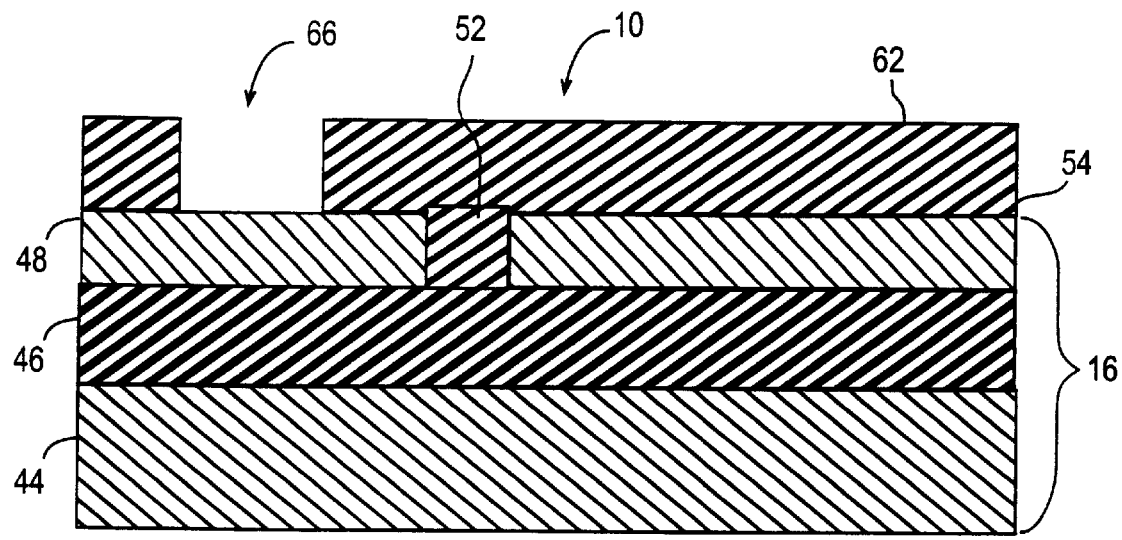
FIG. 2 is a cross-sectional view of the portion of the substrate illustrated in FIG. 1, showing a barrier layer etching step.

With reference to FIGS. 1–5, the fabrication of portion 10, including transistors 12 and 14, is described below. In FIG. 2, portion 10 includes substrate 16 with structure 52. Structure 52 can also be a LOCOS structure or other insulation structure. Preferably, structure 52 is fabricated in a conventional shallow trench isolation (STI) process.

A barrier layer 62 is provided on top surface 54 of layer 48. Preferably, layer 62 is a 500–1000 Å, thick layer of silicon nitride ($Si_3N_4$). Layer 62 is configured in accordance with a photolithographic technique to form an aperture or hole 66. Hole 66 is 0.5 to 1.0 microns wide and is utilized to define a LOCOS structure that will be formed in subsequent steps (See FIG. 3). Preferably, a pad oxide layer (not shown) is provided on top surface 54 before layer 62 is deposited. The pad oxide layer can be a 100 to 200 Å thick layer of thermally grown silicon dioxide. Alternatively, layer 62 can be deposited without a pad oxide layer on top surface 54 of layer 48.

Layer 62 is preferably deposited by chemical vapor deposition (CVD) and selectively etched to form hole 66. Hole 66 corresponds to locations of transistors, such as, transistor 12 which is part of the critical speed path associated with portion 10. Hole 66 exposes layer 48 or the pad oxide layer above layer 48. Layer 62 is etched in a dry-etching process, such as, a plasma etch selective to silicon nitride with respect to silicon.

Figure 3:
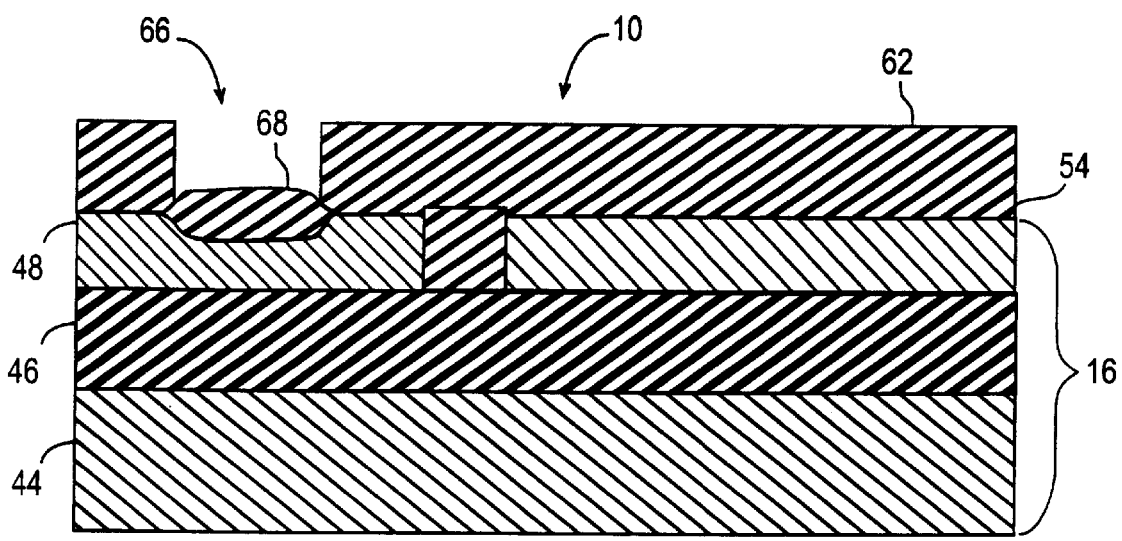
FIG. 3 is a cross-sectional view of the portion of the substrate illustrated in FIG. 2, showing a local oxidation of silicon (LOCOS) step that forms a LOCOS structure.

With reference to FIG. 3, substrate 16 is heated in accordance with a LOCOS process to form an insulation structure, such as, LOCOS structure 68. LOCOS structure 68 is preferably 500–800 Å thick and 0.5–1.0 microns wide. Preferably, LOCOS structure 68 extends 60 percent (300–500 Å) below the original top surface 54 of layer 48 at the location of hole 66. Structure 68 extends 40 percent (200–300 Å) above the original top surface 54 of layer 48.

LOCOS structure 68 consumes layer 48, thereby making layer 48 thinner at the location of structure 68. Accordingly, LOCOS structure 68 advantageously allows controlled thinning of layer 48. By utilizing structure 68, layer 48 can be more accurately thinned than by utilizing solely silicon etching techniques. Structure 68 is preferably grown slowly to ensure a controlled thinning of layer 48.

Figure 4:
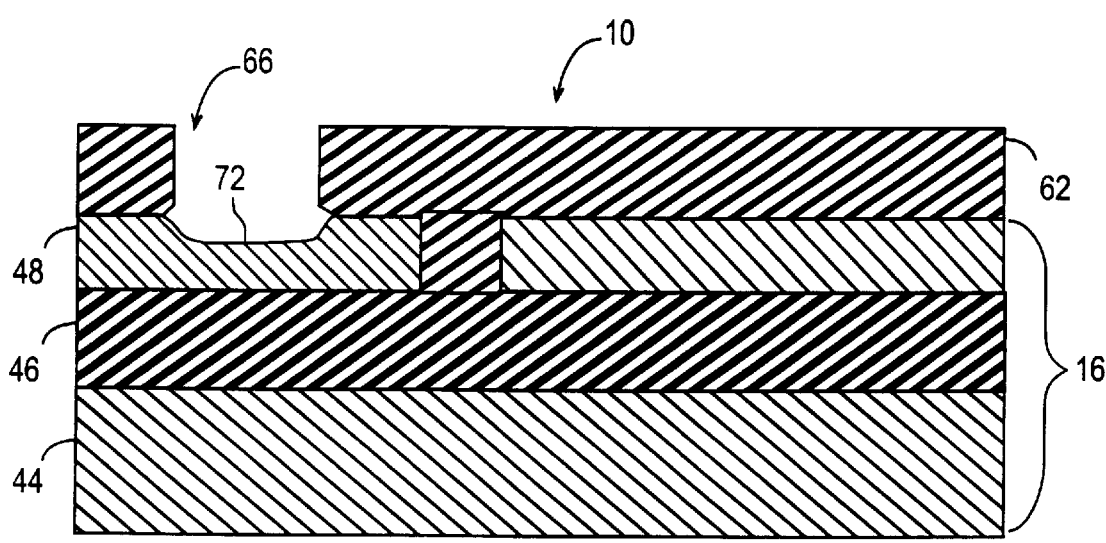
FIG. 4 is a cross-sectional view of the portion of the substrate illustrated in FIG. 3, showing a LOCOS structure etching step.

With reference to FIG. 4, LOCOS structure 68 is removed from substrate 16. Preferably, structure 68 (FIG. 3) is removed in an etching process. Preferably, a dry-etching process selective to silicon dioxide with respect to silicon and silicon nitride is utilized. Other etching or removal processes can be utilized, including a chemical wet etch, a plasma etch, or any technique for removing structure 68. Removing structure 68 leaves a recessed portion 72 in layer 48.

Figure 5:
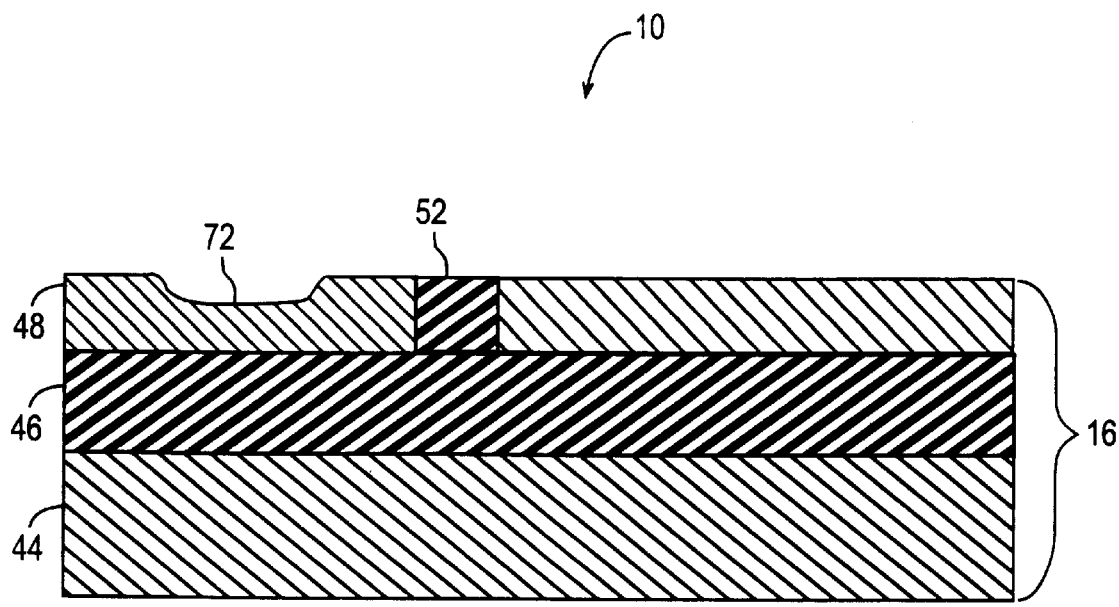
FIG. 5 is a cross-sectional view of the substrate illustrated in FIG. 4, showing a barrier layer stripping step.

Recessed portion 72 of layer 48 is preferably 700–1000 Å thick. Recessed portion 72 has a dish-like formation in accordance with the bird's beak formation associated with structure 68. Recessed portion 72 preferably houses one transistor, such as, transistor 12 (FIG. 1). However, portion 72 can include more than one transistor. In FIG. 5, layer 62 (FIG. 4) is stripped in accordance with a silicon nitride removal process. Layer 62 can be stripped by dry etching, wet etching, or other removal process.

With reference to FIG. 1, gate stacks 18 and 20 are provided in accordance with conventional SOI MOSFET processes. Surface 54 of layer 48 and conductors 40 and 42 can be covered with silicide layer 26. Layer 26 is formed in a conventional process where a refractory metal is deposited over portion 10. The refractory metal is reacted with exposed silicon to form silicide layer 26. Seventy percent of layer 26 is below the original surface of the exposed silicon. The unreacted metal is removed from portion 10. Various conventional processes can be utilized to form drains, sources, contacts, and interconnections for portion 10.

Figure 6:
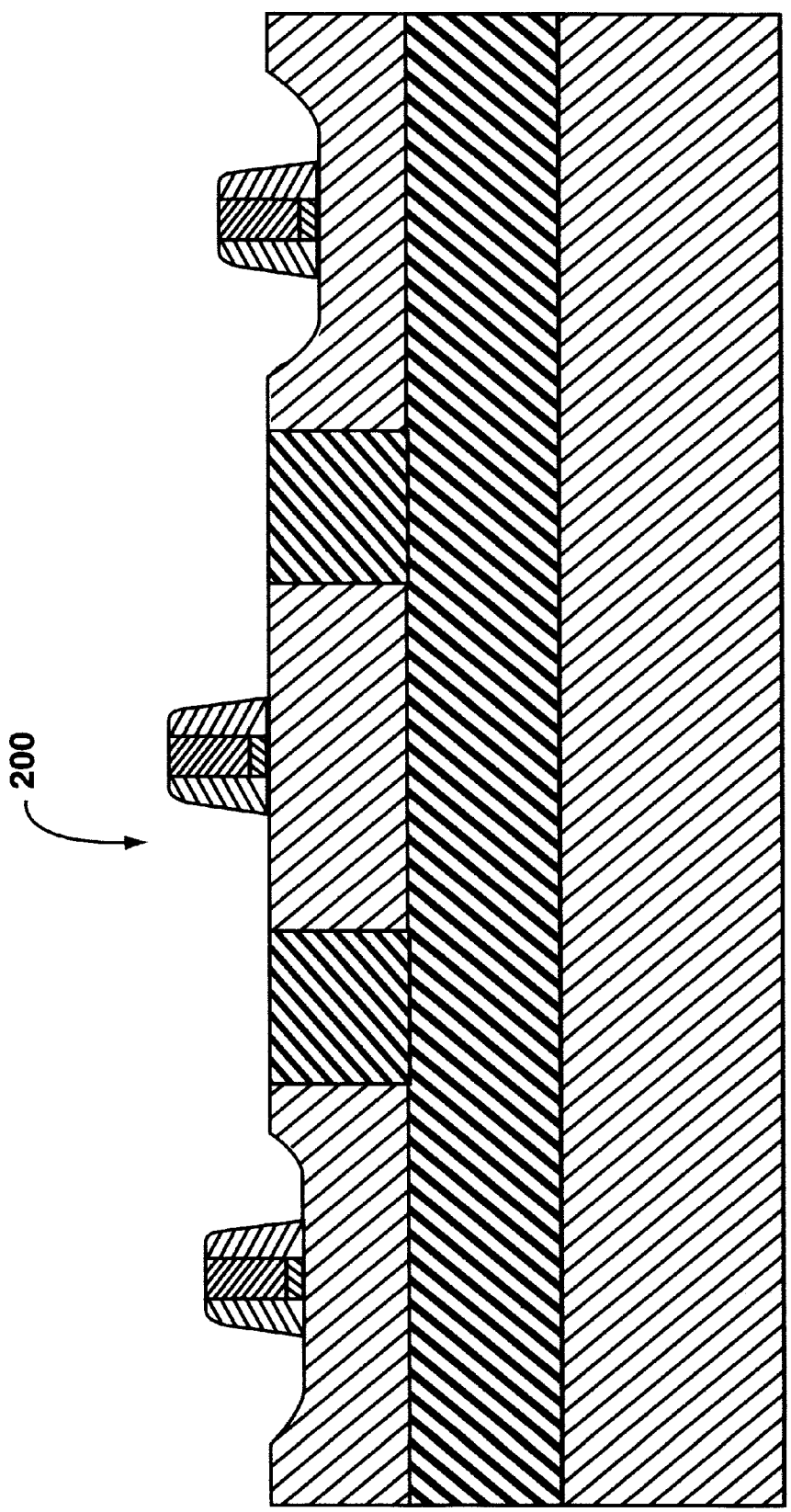
FIG. 6 is a cross sectional view of a portion of an integrated circuit in accordance with another exemplary embodiment of the present invention, the portion including three transistors having different threshold voltages.

In accordance with an alternative embodiment, an IC can include a number, such as four, of transistors (N-channel or P-channel) that are fabricated in accordance with a similar process described with reference to FIGS. 1–5. Each of the transistors can have a different threshold voltage. Another masking step, (FIG. 2), LOCOS step (FIG. 3), and removal step (FIG. 4), in addition to the steps described in FIGS. 1–4, can be utilized for each distinct threshold voltage after the second threshold voltage. Therefore, an integrated circuit (such as, portion 200 in FIG. 6) with transistors with three distinct threshold voltages according to the present invention would utilize one additional masking, LOCOS, and removal step, in addition to the steps discussed with reference to FIGS. 1–4.

In a further embodiment, LOCOS structures are not masked over in subsequent steps and can continue to be grown in subsequent oxidation steps. In this further embodiment, only separate photolithographic etching and heating steps are required to form the LOCOS structures of varying depths. Therefore, an integrated circuit with transistors with three distinct voltages would utilize one additional photolithographic step and LOCOS step in addition to the steps discussed with reference to FIGS. 1–4. In this further embodiment, the thickest LOCOS structure is formed first.

It is understood that while the detailed drawings, specific examples, and particular values given provide a preferred exemplary embodiment of the present invention, the preferred exemplary embodiment is for the purpose of illustration only. The method and apparatus of the invention is not limited to the precise details and conditions disclosed. For example, although LOCOS structures are removed, other types can be utilized to achieve a thin film. Various changes may be made to the details disclosed without departing from the spirit of the invention which is defined by the following claims.

What is claimed is:

1. A method of manufacturing an integrated circuit including a plurality of transistors, the plurality of transistors including a first transistor having a first threshold voltage and a second transistor having a second threshold voltage, the first threshold voltage being different than the second threshold voltage, the method comprising:

forming an oxidation structure at a first location on a substrate, the oxidation structure consuming the portion of the substrate;

removing the oxidation structure, thereby leaving a first recessed portion at the first location on the substrate;

providing a first gate associated with the first transistor at the first location;

providing a second gate associated with the second transistor at a second location on the substrate;

forming a second oxidation structure at a third location on the substrate;

removing the second oxidation structure, thereby leaving a second recessed portion at the third location on the substrate, the second recessed portion being deeper than the first recessed portion; and providing a third gate associated with a third transistor at the third location; wherein the third transistor has a third threshold voltage, the third threshold voltage being different than the first threshold voltage and the second threshold voltage.

2. The method of claim 1, wherein the second threshold voltage is higher than the first threshold voltage and wherein the method further comprises fabricating the first transistor as a part of a speed critical circuit in the integrated circuit.

3. The method of claim 1, further comprising fabricating the third transistor as a fully depleted MOSFET.

4. The method of claim 1, further comprising fabricating the first and second transistors as fully depleted MOSFETS.

5. The method of claim 1, wherein the substrate is a silicon-on-insulator substrate.

6. The method of claim 5, wherein the substrate includes a thin film silicon layer over a buried oxide layer over a silicon base.

7. A method of manufacturing an integrated circuit including a plurality of transistors, the method comprising:

providing a LOCOS structure at a first location on a substrate;

removing the LOCOS structure, thereby leaving a recessed portion at the first location on the substrate;

providing at least one of the transistors above the recessed portion at the first location on the substrate;

providing at least one of the transistors at a second location, the second location being outside the recessed portion, whereby the transistor at the first location has a lower threshold voltage than the transistor at the second location;

providing another LOCOS structure at a third location on a substrate;

removing the LOCOS structure at the third location, thereby leaving a recessed portion at the third location on the substrate; and providing at least one of the transistors above the recessed portion at the third location on the substrate.

8. The method of claim 7, wherein the substrate includes a thin film layer over a buried insulative layer over a base.

9. The method of claim 8, wherein the thin film layer is silicon.

10. The method of claim 7, wherein the LOCOS structure is provided by:

depositing a barrier layer over the thin film layer;

forming an aperture in the barrier layer; and growing the LOCOS structure.

11. The method of claim 7, wherein the removing step includes etching the LOCOS structure with a process more selective to silicon dioxide than to silicon.

12. The method of claim 7 wherein the transistors at the first, second and third locations are fully depleted MOSFETS.

13. The method of claim 12 wherein the transistors are N-channel transistors.

14. The method of claim 13, wherein the step of providing another LOCOS structure includes growing the LOCOS structure in a different heating step from a heating step of the step of providing a LOCOS structure at the first location.

15. A method of manufacturing a ULSI circuit on a semiconductor-on-insulator substrate, the substrate including a semiconductor film, the method comprising:

selectively oxidizing the semiconductor film to form a first structure at a first location;

etching the structure to remove the first structure from the semiconductor film;

forming a first transistor at the first location;

selectively oxidizing the semiconductor film a second time to form a second structure at a second location;

etching the second structure to remove the second structure from the semiconductor film;

forming a second transistor at the second location;

forming a third transistor at third location outside of the first location and the second location, wherein the first transistor has a first threshold voltage, the second transistor has a second threshold voltage and the third transistor has a third threshold voltage.

16. The method of claim 15, wherein the semiconductor film is 700–1500 Å thick and the first structure is 200–500 Å thick.

17. The method of claim 16, wherein the semiconductor film is silicon and the first structure is a LOCOS structure.

18. The method of claim 15, wherein the first selectively oxidizing step includes:

selectively providing a barrier layer over the semiconductor film and heating the substrate.

19. The method of claim 18, further comprising providing a pad oxide layer between the semiconductor film and the barrier layer.

20. The method of claim 19, wherein the barrier layer is silicon nitride.

* * * * *